(12) United States Patent  
Tsen et al.

(10) Patent No.: US 11,924,994 B2  
(45) Date of Patent: Mar. 5, 2024

(54) MANAGING A HEATSINK OF AN INFORMATION HANDLING SYSTEM

(71) Applicant: Dell Products L.P., Round Rock, TX (US)

(72) Inventors: Chiu Jung Tsen, Hsinchu (TW); Yi-Te Chih, New Taipei (TW); John T. Morrison, Round Rock, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 377 days.

(21) Appl. No.: 17/377,979

(22) Filed: Jul. 16, 2021

(65) Prior Publication Data

US 2023/0019710 A1    Jan. 19, 2023

(51) Int. Cl.
*H05K 7/20* (2006.01)
*G10K 11/178* (2006.01)

(52) U.S. Cl.
CPC ..... *H05K 7/20209* (2013.01); *G10K 11/1785* (2018.01); *H05K 7/20163* (2013.01); *H05K 7/20172* (2013.01); *G10K 2210/11* (2013.01); *G10K 2210/129* (2013.01)

(58) Field of Classification Search
None
See application file for complete search history.

(56) References Cited

U.S. PATENT DOCUMENTS

| | | | | |
|---|---|---|---|---|
| 6,100,654 A * | 8/2000 | Izukawa | ................ | H02N 2/142 |
| | | | | 318/116 |
| 6,544,309 B1 * | 4/2003 | Hoefer | .................... | H05K 7/207 |
| | | | | 55/467 |
| 7,161,315 B2 * | 1/2007 | Hsu | ........................ | G03B 21/16 |
| | | | | 353/57 |
| 8,400,766 B2 * | 3/2013 | Kim | ................... | H05K 7/20181 |
| | | | | 361/695 |
| 9,459,669 B2 * | 10/2016 | Hrehor, Jr. | ............ | H01L 23/427 |
| 10,830,545 B2 * | 11/2020 | Poltorak | ............ | H05K 7/20418 |
| 11,598,593 B2 * | 3/2023 | Poltorak | ................. | F28F 21/02 |
| 2006/0260652 A1 * | 11/2006 | Kruse | ....................... | F28G 3/16 |
| | | | | 134/167 R |
| 2007/0058346 A1 * | 3/2007 | Yeh | ........................ | G06F 1/203 |
| | | | | 361/695 |
| 2008/0121373 A1 * | 5/2008 | Wang | ....................... | F28G 7/00 |
| | | | | 165/84 |

(Continued)

FOREIGN PATENT DOCUMENTS

CN            111102059 A  *  5/2020  ............ B08B 1/006

*Primary Examiner* — Jason Lin
(74) *Attorney, Agent, or Firm* — McDermott Will & Emery LLP

(57) ABSTRACT

In one embodiment, a method for managing a heatsink of an information handling system includes: determining, by a controller unit of the information handling system, that a vibration event is to occur, the vibration event associated with a vibration unit of the information handling system, the controller unit communicably coupled to the vibration unit, the vibration unit removably coupled to the heatsink; and causing, by the controller unit, the vibration unit to generate the vibration event, the vibration event causing the vibration unit to apply one or more vibrations to the heatsink, the one or more vibrations causing a boundary layer of particles to be removed from a surface of the heatsink.

17 Claims, 3 Drawing Sheets

(56) References Cited

U.S. PATENT DOCUMENTS

| | | | |
|---|---|---|---|
| 2009/0217888 A1* | 9/2009 | Frach | F23J 3/023 |
| | | | 122/379 |
| 2010/0002389 A1* | 1/2010 | Tung | H05K 7/20172 |
| | | | 361/697 |
| 2017/0059263 A1* | 3/2017 | Sun | H05K 7/20181 |

* cited by examiner

300

```
┌─────────────────────────────────────────────────────────────┐
│ DETERMINE, BY A CONTROLLER UNIT OF AN INFORMATION HANDLING  │
│     SYSTEM, THAT A VIBRATION EVENT IS TO OCCUR.             │
│                        310                                   │
└─────────────────────────────────────────────────────────────┘
                              │
                              ▼
┌─────────────────────────────────────────────────────────────┐
│ CAUSE, BY THE CONTROLLER UNIT, A VIBRATION UNIT TO GENERATE │
│                   THE VIBRATION EVENT.                       │
│                        320                                   │
└─────────────────────────────────────────────────────────────┘
```

FIG. 3

MANAGING A HEATSINK OF AN INFORMATION HANDLING SYSTEM

BACKGROUND

Field of the Disclosure

The disclosure relates generally to information handling systems, and in particular to managing a heatsink of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a method for managing a heatsink of an information handling system includes: determining, by a controller unit of the information handling system, that a vibration event is to occur, the vibration event associated with a vibration unit of the information handling system, the controller unit communicably coupled to the vibration unit, the vibration unit removably coupled to the heatsink; and causing, by the controller unit, the vibration unit to generate the vibration event, the vibration event causing the vibration unit to apply one or more vibrations to the heatsink, the one or more vibrations causing a boundary layer of particles to be removed from a surface of the heatsink.

In one or more of the disclosed embodiments, the method further includes: receiving, by the controller unit, an audio stream captured by an audio sensor of the information handling system, the audio stream including a fan noise generated by a fan of the information handling system; extracting, by the controller unit, a noise waveform from the audio stream, the noise waveform associated with the fan noise; generating, by the controller unit, a noise-cancelling waveform based on the noise waveform, the noise-cancelling waveform having an inverted phase in relation to the noise waveform; and causing, by the controller unit, the vibration unit to generate a noise-cancellation event, the noise-cancellation event causing the vibration unit to apply one or more noise-cancelling vibrations to the heatsink based on the noise-cancelling waveform, the one or more noise-cancelling vibrations causing the fan noise to be reduced.

In one or more of the disclosed embodiments, determining that the vibration event is to occur includes: determining, by the controller unit, that the boundary layer of particles has accumulated on the heatsink.

In one or more of the disclosed embodiments, determining that the boundary layer of particles has accumulated on the heatsink includes: identifying, by the controller unit, a fan speed associated with a fan of the information handling system; identifying, by the controller unit, a device temperature associated with a device of the information handling system; determining, by the controller unit, that the fan speed is above a threshold fan speed; and determining, by the controller unit, that the device temperature is above a threshold device temperature.

In one or more of the disclosed embodiments, determining that the vibration event is to occur includes: determining, by the controller unit, that the information handling system has been powered on.

In one or more of the disclosed embodiments, determining that the vibration event is to occur includes: determining, by the controller unit, that the information handling system is to be powered off.

In one or more of the disclosed embodiments, the one or more vibrations applied to the heatsink comprise one or more ultrasonic vibrations.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 3 is a flowchart depicting selected elements of an embodiment of a method for managing a heatsink of an information handling system.

DESCRIPTION OF PARTICULAR EMBODIMENT(S)

This document describes a method for managing a heatsink of an information handling system that includes: determining, by a controller unit of the information handling system, that a vibration event is to occur, the vibration event associated with a vibration unit of the information handling system, the controller unit communicably coupled to the vibration unit, the vibration unit removably coupled to the heatsink; and causing, by the controller unit, the vibration unit to generate the vibration event, the vibration event causing the vibration unit to apply one or more vibrations to the heatsink, the one or more vibrations causing a boundary layer of particles to be removed from a surface of the heatsink.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 1:
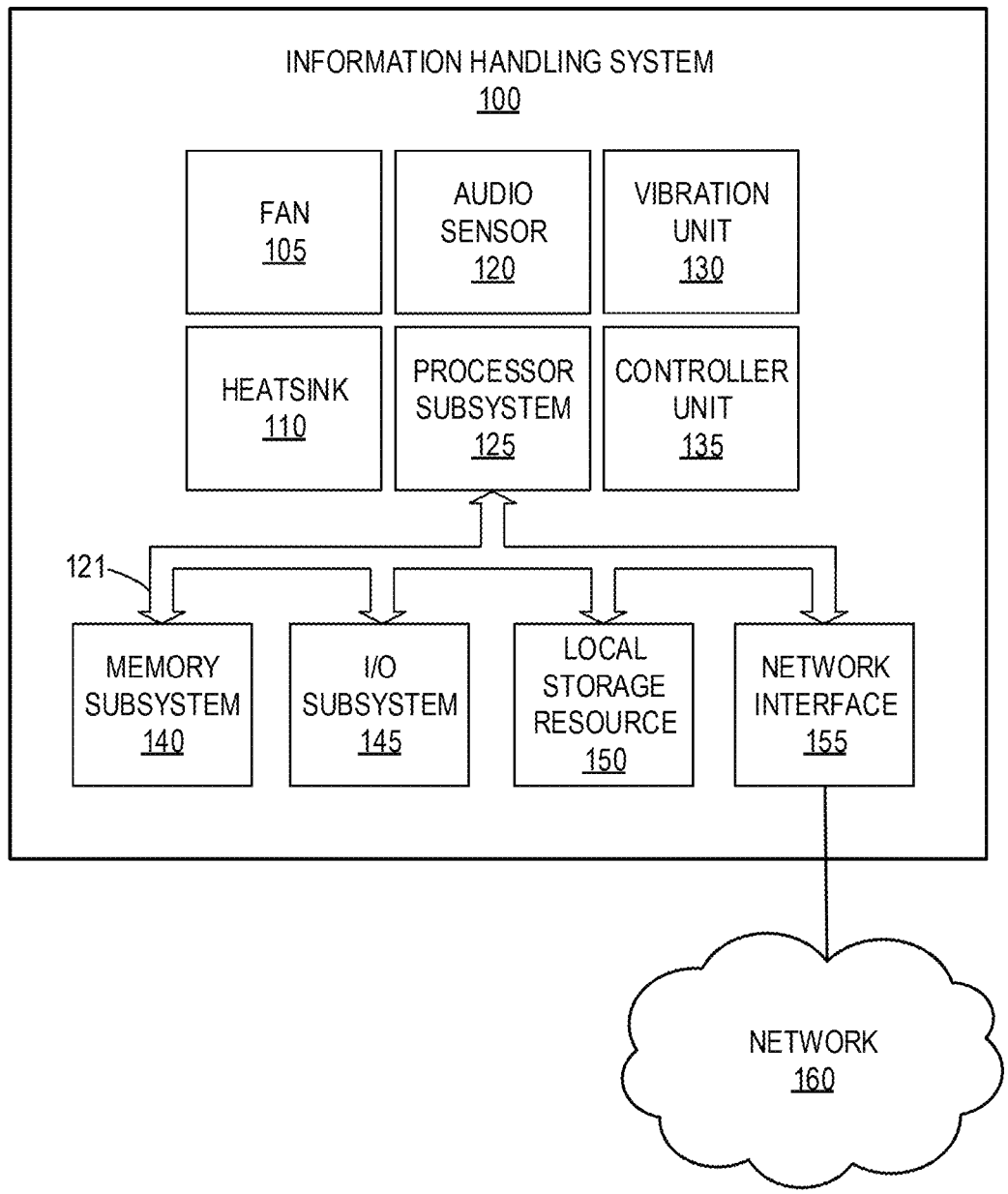
FIG. 1 is a block diagram of selected elements of an embodiment of a computing environment that includes an information handling system.

Particular embodiments are best understood by reference to FIGS. 1-3 wherein like numbers are used to indicate like and corresponding parts.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 125, which may comprise one or more processors, and system bus 121 that communicatively couples various system components to processor subsystem 125 including, for example, a memory subsystem 140, an I/O subsystem 145, a local storage resource 150, and a network interface 155. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include a fan 105, a heatsink 110, an audio sensor 120, a vibration unit 130, and a controller unit 135. In other embodiments, computing environment 165 may include additional, fewer, and/or different components than the components shown in FIG. 1.

In information handling system 100, processor subsystem 125 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 125 may interpret and/or execute program instructions and/or process data stored locally (e.g., in memory subsystem 140 and/or another component of information handling system 100). In the same or alternative embodiments, processor subsystem 125 may interpret and/or execute program instructions and/or process data stored remotely. In one embodiment, processor subsystem 125 may be or include a multi-core processor comprised of one or more processing cores disposed upon an integrated circuit (IC) chip. In other embodiments, processor subsystem 125 may be or include an integrated device (e.g., microcontroller, system on a chip (SoC), and the like) that includes memory, peripheral interfaces, and/or other components suitable for interpreting and/or executing program instructions and/or processing data.

In one embodiment, memory subsystem 140 may comprise a system, device, or apparatus operable to retain and/or retrieve program instructions and/or data for a period of time (e.g., computer-readable media). Memory subsystem 140 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 145 may comprise a system, device, or apparatus generally operable to receive and/or transmit data to, from, and/or within information handling system 100. I/O subsystem 145 may represent, for example, a variety of communication interfaces, graphics interfaces, video interfaces, user input interfaces, and/or peripheral interfaces. In various embodiments, I/O subsystem 145 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 155 may be a suitable system, apparatus, or device operable to serve as an interface between information handling system 100 and a network 160. Network interface 155 may enable information handling system 100 to communicate over network 160 using a suitable transmission protocol and/or standard, including, but not limited to, transmission protocols and/or standards enumerated below with respect to the discussion of network 160. Network 160 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 155 may enable wired and/or wireless communications (e.g., NFC or Bluetooth) to and/or from information handling system 100.

In particular embodiments, network 160 may include one or more routers for routing data between client information handling systems 100 and server information handling systems 100. A device (e.g., a client information handling system 100 or a server information handling system 100) on network 160 may be addressed by a corresponding network address including, for example, an Internet protocol (IP) address, an Internet name, a Windows Internet name service (WINS) name, a domain name or other system name. In particular embodiments, network 160 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 160 and its various components may be implemented using hardware, software, or any combination thereof.

Figure 2A:
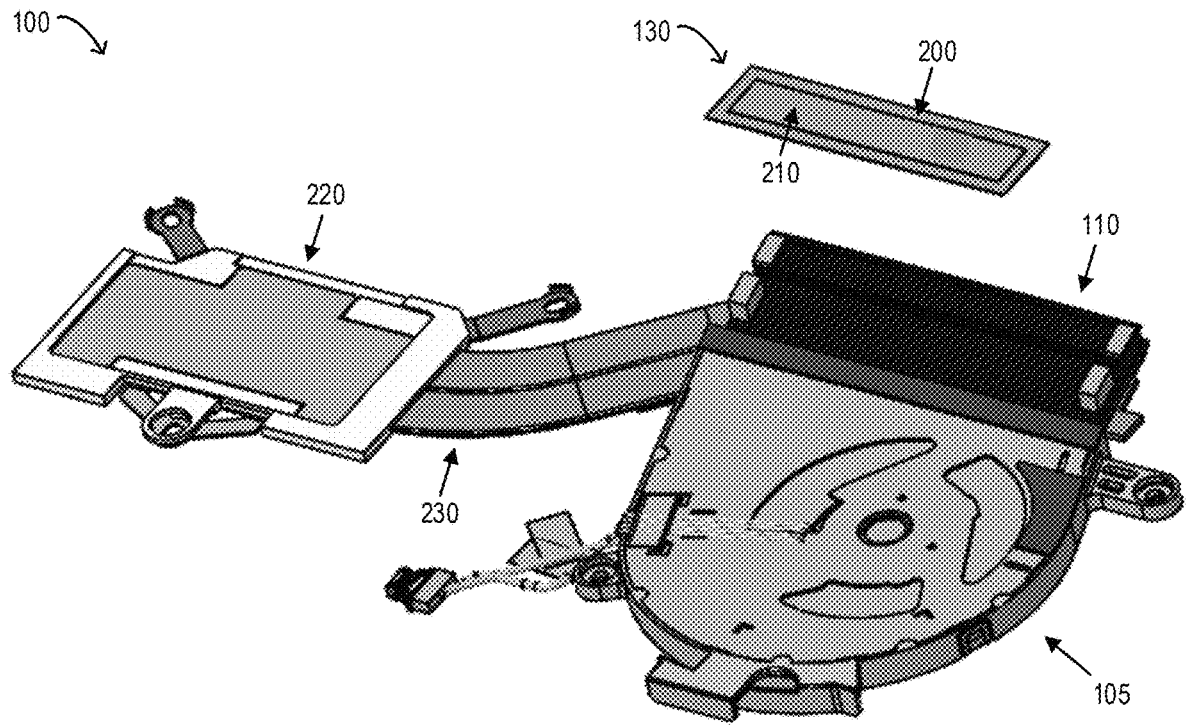
FIGS. 2A and 2B illustrate selected elements of an embodiment of an information handling system.
Figure 2B:
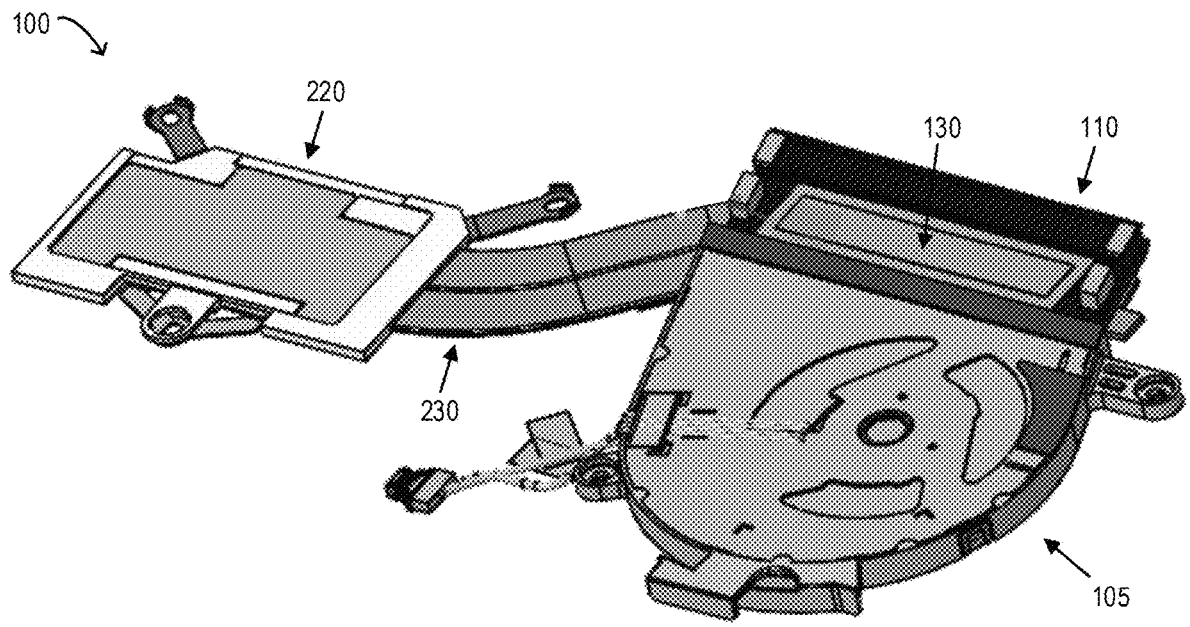

In one embodiment, heatsink 110 may be a suitable system, apparatus, or device operable to transfer heat away from one or more devices of information handling system 100. Specifically, heatsink 110 may be or include a heat exchanger comprised of metal (e.g., copper, aluminum alloy, and the like) operable to absorb heat generated by one or more devices of information handling system 100 and to dissipate the absorbed heat away from the one or more devices, thereby managing respective temperatures of the one or more devices. In one embodiment, heatsink 110 may be comprised of, or otherwise include, one or more fins (not shown in figure) used to emit warm air absorbed by heatsink 110. In this embodiment, a fan may provide a directed airflow across heatsink 110 used to dissipate the warm air emitted from the one or more fins of heatsink 110 to complete the heat exchange. In one embodiment, heatsink 110 may be or include an active heatsink removably coupled to one or more fans (e.g., fan 105 as shown in FIGS. 2A and 2B) to receive a directed airflow. In other embodiments, heatsink 110 may be or include a passive heatsink, a stamped fin heatsink, a bonded fin heatsink, a skived heatsink, and/or any other type of heatsink suitable for transferring heat away from one or more devices of information handling system 100. Heatsink 110 is described in further detail with respect to FIGS. 2A and 2B.

In one embodiment, fan 105 may be a suitable system, apparatus, or device operable to direct an air flow across heatsink 110 to blow heat away from heatsink 110. In particular, fan 105 may be or include a hardware device operable to direct a surrounding air flow across the one or more fins of heatsink 110 to cause the heat released by the one or more fins to exit a housing of information handling system 100 (e.g., via a vent of information handling system 100). In one embodiment, fan 105 may be or include a centrifugal fan that includes a ducted housing to direct outgoing air across heatsink 110. In other embodiments, fan 105 may be or include a positive displacement blower, a helical screw blower, a high-speed blower, a regenerative blower, and/or any other type of blower suitable for directing a surrounding air flow across heatsink 110. Fan 105 is described in further detail with respect to FIGS. 2A and 2B.

In one embodiment, audio sensor 120 may be a suitable system, apparatus, or device operable to capture an audio stream within information handling system 100. In particular, audio sensor 120 may be or include a hardware device operable to capture an audio stream that includes a fan noise generated by a fan (e.g., fan 250) of information handling system 100. In one embodiment, audio sensor 120 may be or include a dynamic microphone communicatively coupled to controller unit 135. In other embodiments, audio sensor 120 may be or include a microelectromechanical systems (MEMS) microphone, a dynamic universal serial bus (USB) microphone, and/or any combination of audio sensors suitable for capturing an audio stream within information handling system 100. Audio sensor 120 is described in further detail with respect to FIGS. 2A and 2B.

In one embodiment, vibration unit 130 may be a suitable system, apparatus, or device operable to convert electrical energy into mechanical displacement. In particular, vibration unit 130 may be or include a hardware device that includes circuitry (e.g., transducers) operable to cause a haptic response, or a "vibration event," in vibration unit 130. In one embodiment, vibration unit 130 may be removably coupled to heatsink 110 (e.g., as shown in FIG. 2B) such that vibration unit 130 may apply one or more vibrations to heatsink 110 as vibration unit 130 vibrates. In addition, vibration unit 130 may be communicably coupled to controller unit 135 such that vibration unit 130 may receive a voltage from controller unit 135 and may convert the electrical energy into mechanical displacement causing vibration unit 130 to compress and expand in response to the applied voltage. Such mechanical displacement may generate a force causing vibration unit 130 to apply the one or more vibrations to heatsink 110. In one embodiment, vibration unit 130 may be or include a piezoelectric element comprised of one or more rigid materials (e.g., ceramic, metal, and the like). In other embodiments, vibration unit 130 may be or include a piezoelectric motor, a piezoelectric actuator, an amplified piezoelectric actuator, and/or any other piezoelectric element suitable for converting electrical energy into mechanical displacement. Vibration unit 130 is described in further detail with respect to FIGS. 2A and 2B.

In one embodiment, controller unit 135 may be a suitable system, apparatus, or device operable to operate, control, and/or otherwise manage, vibration unit 130. Specifically, controller unit 135 may be or include a hardware device (e.g., microcontroller unit, field-programmable gate array, integrated circuit, and the like) that includes circuitry operable to cause a vibration event in vibration unit 130. That is, controller unit 135 may be communicably coupled to vibration unit 130 such that controller unit 135 may cause vibration unit 130 to generate a vibration event. In one embodiment, the vibration event caused by controller unit 135 may be in response to controller unit 135 determining that a boundary layer of particles has accumulated on heatsink 110. In particular, controller unit 135 may cause the vibration event upon determining that a boundary layer of particles has accumulated on and/or within a stack of fins of heatsink 110, thereby decreasing overall thermal performance of information handling system 100. In another embodiment, the vibration event caused by controller unit 135 may be in response to controller unit 135 determining that information handling system 100 has been powered on and/or is to be powered off. Specifically, controller unit 135 may cause the vibration event upon determining that information handling system 100 has been powered on and may require the removal of particles that may have accumulated while information handling system 100, and/or the components therein, were inactive while in a powered off state. Similarly, controller unit 135 may cause the vibration event upon determining that information handling system 100 is to be powered off and may require the removal of particles that may have accumulated before information handling system 100, and/or the components therein, return to a powered off state.

Conventional thermal solutions may direct an air flow through a stack of fins of a heatsink to transfer heat away from a system. However, such conventional thermal solutions may cause particles (e.g., dust, lint, and the like) to become trapped on and/or within the stack of fins, forming a boundary layer of particles over time that may result in decreased thermal performance. Such thermal fouling may eventually cause the system to overheat as the particles act as an insulating layer on and/or within the stack of fins and may increase wear on system components leading to failure over time. For example, dust accumulation forming a boundary layer on and/or within a stack of fins of a heatsink may cause a system to increase the speed of a fan to compensate for decreased thermal performance caused by the boundary layer as the system temperature increases. However, this increased fan speed may cause wear on the fan as the fan's rotational speed increases, thereby decreasing the lifecycle of the fan while affording minimal improvements to the overall heat exchange rate within the system. As such, boundary layer accumulation caused by conventional thermal solutions may result in decreased thermal performance leading to system overheating, increased wear on system components leading to decreased component lifecycle, and an overall decrease in user experience.

In contrast, controller unit 135 may remove a boundary layer of particles from a surface of heatsink 110 to increase thermal performance of information handling system 100. As described above, controller unit 135 may cause vibration unit 130 to generate a vibration event in response to determining that a boundary layer of particles has accumulated on heatsink 110. The vibration event may be or include a haptic response causing vibration unit 130 to apply one or more vibrations to heatsink 110 as vibration unit 130 vibrates. In particular, controller unit 135 may apply a voltage to vibration unit 130 to cause vibration unit 130 to convert the electrical energy into mechanical displacement as vibration unit 130 compresses and expands in response to the applied voltage. As described above, such mechanical displacement may generate a force causing vibration unit 130 to apply the one or more vibrations to heatsink 110. In one embodiment, the frequency of the one or more vibrations of vibration unit 130 may be proportional to the magnitude of voltage applied. For example, controller unit 135 may apply a first voltage causing vibration unit 130 to generate one or more ultrasonic vibrations (i.e., greater than 20 kHz) and may apply a second lower voltage causing vibration unit 130 to generate one or more acoustic vibrations (i.e., less than 20 kHz).

In one embodiment, controller unit 135 may determine that a vibration event is to occur upon determining that a boundary layer of particles has accumulated on heatsink 110. In particular, controller unit 135 may identify a fan speed associated with fan 105 and may determine that the fan speed is above a threshold fan speed. For example, controller unit 135 may identify that a fan speed of fan 105 is rotating at 5,100 revolutions per minute (RPMs) and may determine that the fan speed is above a threshold fan speed of 5,000 RPMs. Similarly, controller unit 135 may identify a device temperature associated with a device of information handling system 100 and may determine that the device temperature is above a threshold device temperature. For example, controller unit 135 may identify that processor subsystem 125 is operating at a device temperature of 176° F. and may determine that the device temperature of processor subsystem 125 exceeds a threshold device temperature of 150° F. In one embodiment, determining that the fan speed is above the threshold fan speed and that the device temperature is above the threshold device temperature may indicate that a boundary layer of particles has accumulated on heatsink 110 (i.e., a heatsink of the device), causing fan 105 to increase fan speed above the threshold while affording minimal improvements to the overall heat exchange rate within information handling system 100. Thus, controller unit 135 may determine that a vibration event is to occur and may cause vibration unit 130 to apply one or more vibrations to the surface of heatsink 110 to remove the boundary layer and increase the thermal performance of information handling system 100.

FIGS. 2A and 2B illustrate selected elements of an embodiment of an information handling system. In the embodiment illustrated in FIGS. 2A and 2B, information handling system 100 includes a device mounting portion 220, a heat pipe 230, heatsink 110, a vibration unit 130, a controller unit 135 (not shown in figure), an audio sensor 120 (not shown in figure), and a fan 105. Vibration unit 130 includes piezo portion 210 and mounting portion 200. In one embodiment, piezo portion 210 of vibration unit 130 may be or include a piezoelectric element operable to generate one or more vibrations in response to receiving a voltage applied by controller unit 135 as described above with respect to FIG. 1. Mounting portion 200 of vibration unit 130 may be or include a rigid element that is laminated, or otherwise coupled, to piezo portion 210 and that is operable to protect piezo portion 210 as vibration unit 130 applies one or more vibrations to heatsink 110. In other embodiments, information handling system 100 may include additional, fewer, and/or different components than the components shown in FIGS. 2A and 2B.

In the embodiment illustrated in FIGS. 2A and 2B, information handling system 100 may include heatsink 110 and fan 105 designed to draw heat away from device mounting portion 220 and/or heat pipe 230 and to blow the drawn heat away from a device removably coupled to mounting portion 220, respectively. However, on-board fan assemblies (e.g., fan 105) may generate loud acoustics, such as a fan noise, while in use that may be distracting to a user. Further, the noise generated by on-board fan assemblies may be worsened during instances in which a user may require an increased performance from of information handling system 100. For example, a user may increase a clock rate of a graphics processing unit (GPU) of information handling system 100 to cause the GPU to run at a higher speed than that which it was manufactured to run, thereby "overclocking" the GPU to increase performance. In response, on-board fan assemblies may be required to operate at a higher rotational speed to compensate for an increased voltage being consumed by the overclocked GPU, which may increase overall acoustics generated by information handling system 100.

In one embodiment, controller unit 135 may cause a noise-cancelling haptic response, or a "noise-cancelling event," in vibration unit 130 to cause fan noise generated by fan 105 to be reduced. In particular, controller unit 135 may cause a noise-cancelling event in response to controller unit 135 determining that a fan noise is above a threshold fan noise (e.g., 20 decibels). In one embodiment, controller unit 135 may receive an audio stream captured by audio sensor 120 (shown in FIG. 1) disposed proximate to an air outlet of fan 105. The audio stream captured by audio sensor 120 may include a fan noise generated by fan 105. Upon receiving the audio stream from audio sensor 120, controller unit 135 may extract a waveform, or a "noise waveform," associated with the fan noise from the audio stream. Once the noise waveform has been extracted, controller unit 135 may generate a waveform, or a "noise-cancelling waveform," based on the noise waveform such that the noise-cancelling waveform may have an inverted phase in relation to the noise waveform. Controller unit 135 may then cause vibration unit 130 to generate a noise-cancelling event. The noise-cancelling event may cause vibration unit 130 to apply one or more noise-cancelling vibrations to heatsink 110 based on, or in accordance with, the noise-cancelling waveform generated by controller unit 135. The one or more noise-cancelling vibrations applied by vibrations unit 130 may cause the fan noise to be reduced due to destructive interference between the noise waveform and the noise-cancelling waveform, thereby decreasing the overall acoustics generated by information handling system 100.

In one embodiment, controller unit 135 may additionally generate one or more waveforms operable to enhance audio quality of multimedia presented to a user via information handling system 100. In particular, controller unit 135 may generate a waveform, or a "tweeter waveform," having a frequency associated with that of a tweeter (e.g., within a range of 2 kHz to 20 kHz). In this embodiment, vibration unit 130 may generate one or more vibrations based on, or in accordance with, the tweeter waveform. The one or more vibrations applied by vibration unit 130 to heatsink 110 may cause an audible high-frequency representation of the audio associated with the multimedia being presented to the user (e.g., via one or more speakers of information handling system 100). That is, the one or more vibrations based on the tweeter waveform may be generated to supplement the audio associated with the multimedia being presented, thereby enhancing audio quality for the user.

FIG. 3 is a flowchart depicting selected elements of an embodiment of a method for managing a heatsink of an information handling system. It is noted that certain operations described in method 300 may be optional or may be rearranged in different embodiments.

Method 300 may begin at step 310, where a controller unit of the information handling system may determine that a vibration event is to occur. The vibration event may be associated with a vibration unit of the information handling system. The controller unit may be communicably coupled to the vibration unit and the vibration unit may be removably coupled to the heatsink. For example, controller unit 135 may determine that a vibration event is to occur upon determining that a boundary layer of particles has accumulated on heatsink 110 as described above with respect to FIG. 1. Controller unit 135 may be communicably coupled to vibration unit 130 as described above with respect to FIG. 1. Vibration unit 130 may be removably coupled to heatsink 110 as shown in FIG. 2B. In step 320, the controller unit may cause the vibration unit to generate the vibration event. The vibration event may cause the vibration unit to apply one or more vibrations to the heatsink. The one or more vibrations may cause a boundary layer of particles to be removed from a surface of the heatsink. For example, controller unit 135 may cause vibration unit 130 to generate a vibration event in response to determining that a boundary layer of particles has accumulated on heatsink 110 as described above with respect to FIG. 1. The vibration event may be or include a haptic response causing vibration unit 130 to apply one or more vibrations to heatsink 110 as vibration unit 130 vibrates. Controller unit 135 may apply a voltage to vibration unit 130 to cause vibration unit 130 to convert the electrical energy into mechanical displacement as vibration unit 130 compresses and expands in response to the applied voltage. Such mechanical displacement may generate a force causing vibration unit 130 to apply the one or more vibrations to heatsink 110, thereby causing the boundary layer of particles to be removed from the surface of heatsink 110.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for managing a heatsink of an information handling system, the method comprising:
    determining, by a controller unit of the information handling system, that a vibration event is to occur, the vibration event associated with a vibration unit of the information handling system, the controller unit communicably coupled to the vibration unit, the vibration unit removably coupled to the heatsink;
    causing, by the controller unit, the vibration unit to generate the vibration event, the vibration event causing the vibration unit to apply one or more vibrations to the heatsink, the one or more vibrations causing a boundary layer of particles to be removed from a surface of the heatsink;
    receiving, by the controller unit, an audio stream captured by an audio sensor of the information handling system, the audio stream including a fan noise generated by a fan of the information handling system;
    extracting, by the controller unit, a noise waveform from the audio stream, the noise waveform associated with the fan noise;
    generating, by the controller unit, a noise-cancelling waveform based on the noise waveform, the noise-cancelling waveform having an inverted phase in relation to the noise waveform; and
    causing, by the controller unit, the vibration unit to generate a noise-cancellation event, the noise-cancellation event causing the vibration unit to apply one or more noise-cancelling vibrations to the heatsink based on the noise-cancelling waveform, the one or more noise-cancelling vibrations causing the fan noise to be reduced.

2. The method of claim 1, wherein determining that the vibration event is to occur comprises:
    determining, by the controller unit, that the boundary layer of particles has accumulated on the heatsink.

3. The method of claim 2, wherein determining that the boundary layer of particles has accumulated on the heatsink comprises:
    identifying, by the controller unit, a fan speed associated with a fan of the information handling system;
    identifying, by the controller unit, a device temperature associated with a device of the information handling system;
    determining, by the controller unit, that the fan speed is above a threshold fan speed; and
    determining, by the controller unit, that the device temperature is above a threshold device temperature.

4. The method of claim 1, wherein determining that the vibration event is to occur comprises:
    determining, by the controller unit, that the information handling system has been powered on.

5. The method of claim 1, wherein determining that the vibration event is to occur comprises:
    determining, by the controller unit, that the information handling system is to be powered off.

6. The method of claim 1, wherein the one or more vibrations applied to the heatsink comprise one or more ultrasonic vibrations.

7. One or more computer-readable non-transitory storage media embodying software that is operable when executed to:
    determine, by a controller unit of an information handling system, that a vibration event is to occur, the vibration event associated with a vibration unit of the information handling system, the controller unit communicably coupled to the vibration unit, the vibration unit removably coupled to a heatsink of the information handling system;
    cause, by the controller unit, the vibration unit to generate the vibration event, the vibration event causing the vibration unit to apply one or more vibrations to the heatsink, the one or more vibrations causing a boundary layer of particles to be removed from a surface of the heatsink;
    receive, by the controller unit, an audio stream captured by an audio sensor of the information handling system, the audio stream including a fan noise generated by a fan of the information handling system;
    extract, by the controller unit, a noise waveform from the audio stream, the noise waveform associated with the fan noise;
    generate, by the controller unit, a noise-cancelling waveform based on the noise waveform, the noise-cancelling waveform having an inverted phase in relation to the noise waveform; and
    cause, by the controller unit, the vibration unit to generate a noise-cancellation event, the noise-cancellation event causing the vibration unit to apply one or more noise-cancelling vibrations to the heatsink based on the noise-cancelling waveform, the one or more noise-cancelling vibrations causing the fan noise to be reduced.

8. The media of claim 7, wherein to determine that the vibration event is to occur, the software is further operable when executed to:
    determine, by the controller unit, that the boundary layer of particles has accumulated on the heatsink.

9. The media of claim 8, wherein to determine that the boundary layer of particles has accumulated on the heatsink, the software is further operable when executed to:
    identify, by the controller unit, a fan speed associated with a fan of the information handling system;
    identify, by the controller unit, a device temperature associated with a device of the information handling system;
    determine, by the controller unit, that the fan speed is above a threshold fan speed; and
    determine, by the controller unit, that the device temperature is above a threshold device temperature.

10. The media of claim 7, wherein to determine that the vibration event is to occur, the software is further operable when executed to:
    determine, by the controller unit, that the information handling system has been powered on.

11. The media of claim 7, wherein to determine that the vibration event is to occur, the software is further operable when executed to:
    determine, by the controller unit, that the information handling system is to be powered off.

12. The media of claim 7, wherein the one or more vibrations applied to the heatsink comprise one or more ultrasonic vibrations.

13. A computing environment, comprising:
an information handling system including one or more processors; and
one or more computer-readable non-transitory storage media coupled to one or more of the processors and comprising instructions operable when executed by one or more of the processors to cause the system to:
determine, by a controller unit of the information handling system, that a vibration event is to occur, the vibration event associated with a vibration unit of the information handling system, the controller unit communicably coupled to the vibration unit, the vibration unit removably coupled to a heatsink of the information handling system; and
cause, by the controller unit, the vibration unit to generate the vibration event, the vibration event causing the vibration unit to apply one or more vibrations to the heatsink, the one or more vibrations causing a boundary layer of particles to be removed from a surface of the heatsink;
receive, by the controller unit, an audio stream captured by an audio sensor of the information handling system, the audio stream including a fan noise generated by a fan of the information handling system;
extract, by the controller unit, a noise waveform from the audio stream, the noise waveform associated with the fan noise;
generate, by the controller unit, a noise-cancelling waveform based on the noise waveform, the noise-cancelling waveform having an inverted phase in relation to the noise waveform; and
cause, by the controller unit, the vibration unit to generate a noise-cancellation event, the noise-cancellation event causing the vibration unit to apply one or more noise-cancelling vibrations to the heatsink based on the noise-cancelling waveform, the one or more noise-cancelling vibrations causing the fan noise to be reduced.

14. The computing environment of claim 13, wherein to determine that the vibration event is to occur, the processors are further operable when executed to:
determine, by the controller unit, that the boundary layer of particles has accumulated on the heatsink.

15. The computing environment of claim 14, wherein to determine that the boundary layer of particles has accumulated on the heatsink, the processors are further operable when executed to:
identify, by the controller unit, a fan speed associated with a fan of the information handling system;
identify, by the controller unit, a device temperature associated with a device of the information handling system;
determine, by the controller unit, that the fan speed is above a threshold fan speed; and
determine, by the controller unit, that the device temperature is above a threshold device temperature.

16. The computing environment of claim 13, wherein to determine that the vibration event is to occur, the processors are further operable when executed to:
determine, by the controller unit, that the information handling system has been powered on.

17. The computing environment of claim 13, wherein to determine that the vibration event is to occur, the processors are further operable when executed to:
determine, by the controller unit, that the information handling system is to be powered off.

* * * * *